United States Patent
Miyajima (10) Patent No.: US 6,199,604 B1
(45) Date of Patent: Mar. 13, 2001

(54) CLEAN BOX, CLEAN TRANSFER METHOD AND APPARATUS THEREFOR

(75) Inventor: Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/294,006

(22) Filed: Apr. 19, 1999

(51) Int. Cl.[7] .................................................. B65G 49/00
(52) U.S. Cl. .............................. 141/98; 141/63; 141/348; 220/212; 220/240; 215/270
(58) Field of Search ........................ 141/63, 98, 348, 141/349; 220/212, 240; 215/228, 270; 206/710–712

(56) References Cited

U.S. PATENT DOCUMENTS

| | | | |
|---|---|---|---|
| 3,929,253 | * 12/1975 | Johnsson | 220/240 |
| 5,139,459 | 8/1992 | Takahashi et al. | 454/187 |
| 5,217,053 | * 6/1993 | Foster et al. | 141/98 |
| 5,364,219 | 11/1994 | Takahashi et al. | 414/217 |
| 5,730,573 | 3/1998 | Masujima et al. | 414/217 |
| 5,810,062 | * 9/1998 | Bonora et al. | 141/98 |
| 5,988,233 | * 11/1999 | Fosnight et al. | 141/63 |

FOREIGN PATENT DOCUMENTS

| | | |
|---|---|---|
| 63-28047 | 2/1988 | (JP) . |
| 2525284 | 5/1996 | (JP) . |
| 9-246351 | 9/1997 | (JP) . |
| 2722306 | 11/1997 | (JP) . |
| 10-56050 | 2/1998 | (JP) . |
| 2757102 | 3/1998 | (JP) . |
| 10-321695 | 12/1998 | (JP) . |
| 10-321696 | 12/1998 | (JP) . |

* cited by examiner

Primary Examiner—J. Casimer Jacyna
(74) Attorney, Agent, or Firm—Oblon, Spivak, McClelland, Maier & Neustadt, P.C.

(57) ABSTRACT

Using a clean box comprising a box body having an aperture in one side surface, a side lid for hermetically closing the aperture, and gas inlet and outlet valves provided in the box body and having neither an evacuation device nor a transfer device, the gas inlet and outlet valves are opened by a gas feeding/discharging mechanism in a state in which the aperture of the box body is closed by the side lid, a non-oxidizing gas is introduced through one of the gas inlet and outlet valves into the clean box, and a gas having filled the clean box before the introduction of the non-oxidizing gas is discharged through the other of the gas inlet and outlet valves.

3 Claims, 5 Drawing Sheets

CLEAN BOX, CLEAN TRANSFER METHOD AND APPARATUS THEREFOR

BACKGROUND OF THE INVENTION

1. Field of the Invention

The present invention relates to a clean box constructed in such structure that objects to be transferred, necessary for production processes of semiconductors, electron-device-associated products, optical disks, etc., can be transferred in a sealed state with a clean gas containing no contaminants and, particularly, in such structure that the objects to be transferred can be transferred or stored in a sealed state with a non-oxidizing gas such as nitrogen gas, an inert gas, or the like so as to prevent oxidation of the objects to be transferred, and also relates to a clean transfer method and apparatus using the clean box.

2. Related Background Art

In general, the clean boxes of this type are arranged to have a box body having an aperture in one surface and an opening/closing lid for hermetically closing the aperture and include those using a mechanical seal with springs or the like for holding the opening/closing lid or those having the structure for vacuum suction of the opening/closing lid with higher adhesion, as described in Japanese Laid-open Patent Application No. 10-321696 (laid open on Dec. 4, 1998) of the invention invented by the same inventor and assigned to the same assignee as the present invention, than in the case of the mechanical seal using the springs or the like.

In use of such clean boxes, it was the conventional practice to put the objects to be transferred, such as semiconductor wafers or the like, in the clean box under the atmospheric pressure in a state filled with the clean air and prevent dust and various fine particles from attaching onto the objects to be transferred by hermetically closing the inside by the opening/closing lid.

Incidentally, with recent decrease in design rules of semiconductors to 0.25 $\mu$m or less, the thickness of film has to be controlled in the angstrom order. Particularly, there occurs a phenomenon that an unintended oxide film is naturally formed on a semiconductor wafer when it is exposed only to the atmosphere in the clean box and it becomes hard to control the film thickness in steps thereafter.

For preventing this, there was a technology in which nitrogen gas is introduced into the hermetically closed space while discharging the gas inside the hermetically closed space to the outside, thereby gradually decreasing the concentration of oxygen, but there was no conventional suggestion about a configuration for replacing the gas inside the clean box with nitrogen while maintaining good hermetic sealing.

SUMMARY OF THE INVENTION

A first object of the present invention is, in view of the above points, to provide a clean box having such structure that an inside space thereof can be replaced readily with a non-oxidizing gas such as nitrogen, an inert gas, or the like and permitting transfer or storage of the objects to be transferred, in a sealed state with the non-oxidizing gas.

A second object of the present invention is to provide a clean transfer method and apparatus permitting transfer of the objects to be transferred, in the sealed state with the non-oxidizing gas, using the clean box having such structure that the inside space thereof can be replaced readily with the non-oxidizing gas such as nitrogen, the inert gas, or the like.

The other objects and novel features of the present invention will become apparent in the description of embodiment hereinafter.

For accomplishing the above objects, a clean box of the present invention comprises a box body having an aperture in one surface, an opening/closing lid for hermetically closing the aperture, and a gas inlet valve and a gas outlet valve provided in the box body.

The clean box may be so constructed that the gas inlet valve and gas outlet valve have the same structure and each of the valves comprises a valve body urged in such a direction as to close a small aperture for inlet/exhaust of gas, and a filter for removal of dust disposed in a gas intake/exhaust passage running from the small aperture to an inside space of the box body.

A clean transfer method of the present invention is a clean transfer method using a clean box comprising a box body having an aperture in one surface, an opening/closing lid for hermetically closing the aperture, and a gas inlet valve and a gas outlet valve provided in the box body, the clean transfer method comprising steps of opening the gas inlet valve and gas outlet valve by a gas feeding/discharging mechanism in a state in which the aperture of said box body is closed by the opening/closing lid, introducing a non-oxidizing gas through the gas inlet valve into the clean box, and discharging a gas having filled the clean box before the introducing step of the non-oxidizing gas, through the gas outlet valve from the clean box.

Further, a clean transfer apparatus of the present invention is a clean transfer apparatus comprising:

a clean box comprising a box body having an aperture in one surface, an opening/closing lid for hermetically closing the aperture, and a gas inlet valve and a gas outlet valve provided in the box body; and a gas feeding/discharging mechanism for opening the gas inlet valve and gas outlet valve in a state in which the aperture of the box body is closed by the opening/closing lid, introducing a non-oxidizing gas through the gas inlet valve into the clean box, and discharging a gas having filled the clean box before the introduction of the non-oxidizing gas, through the gas outlet valve from the clean box.

The clean transfer apparatus may be so constructed that the gas inlet valve and gas outlet valve have the same structure and each of the valves comprises a valve body urged in such a direction as to close a small aperture for intake/exhaust of gas, and a filter for removal of dust disposed in a gas intake/exhaust passage running from the small aperture to an inside space of the box body, and that the gas feeding/discharging mechanism has intake/exhaust passages in communication with the respective small apertures for intake/exhaust of gas and actuating pins, each being arranged to push the valve body so as to open the small aperture.

Since the present invention presents the clean box in the structure comprising the box body having the aperture in one surface, the opening/closing lid for hermetically closing the aperture, and the gas inlet valve and gas outlet valve provided in the box body, the inside space can be replaced readily with the non-oxidizing gas such as the nitrogen gas, the inert gas, or the like in a perfect, hermetically closed state using the gas inlet valve and gas outlet valve, and the replacement operation can be automated. When each of the gas inlet valve and gas outlet valve is provided with the filter for removal of dust, the dust and other fine particles can be prevented from entering the clean box.

The clean box according to the present invention has neither evacuation means itself, such as a pump, for evacuating the inside of the box, nor transfer means for transferring the box.

DETAILED DESCRIPTION OF THE PREFERRED EMBODIMENT

An embodiment of the clean box and the clean transfer method and apparatus according to the present invention will be described below referring to the drawings.

Figure 1:
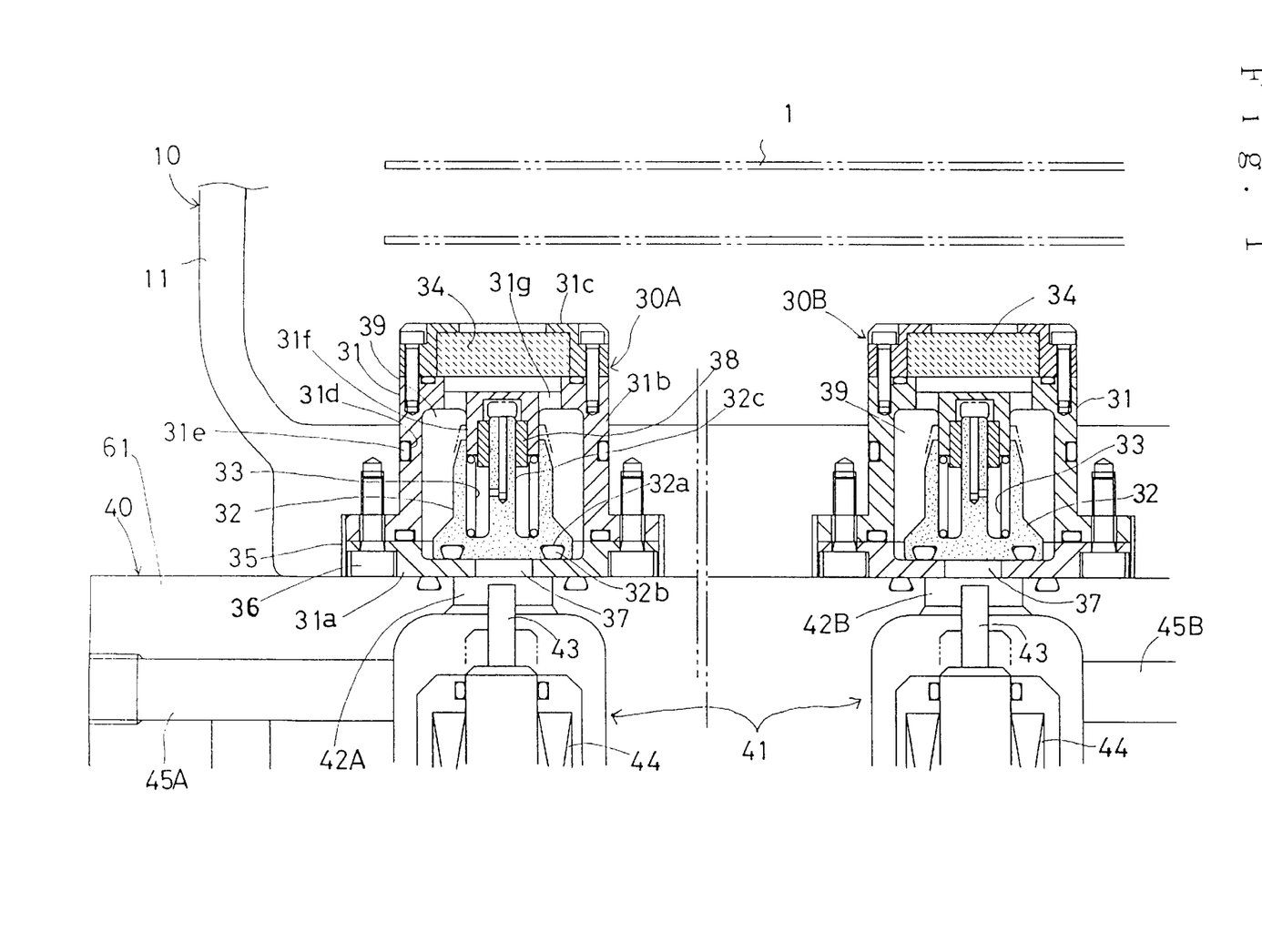
FIG. 1 is a sectional view of an enlarged main part of the clean box as an embodiment of the present invention.
Figure 2:
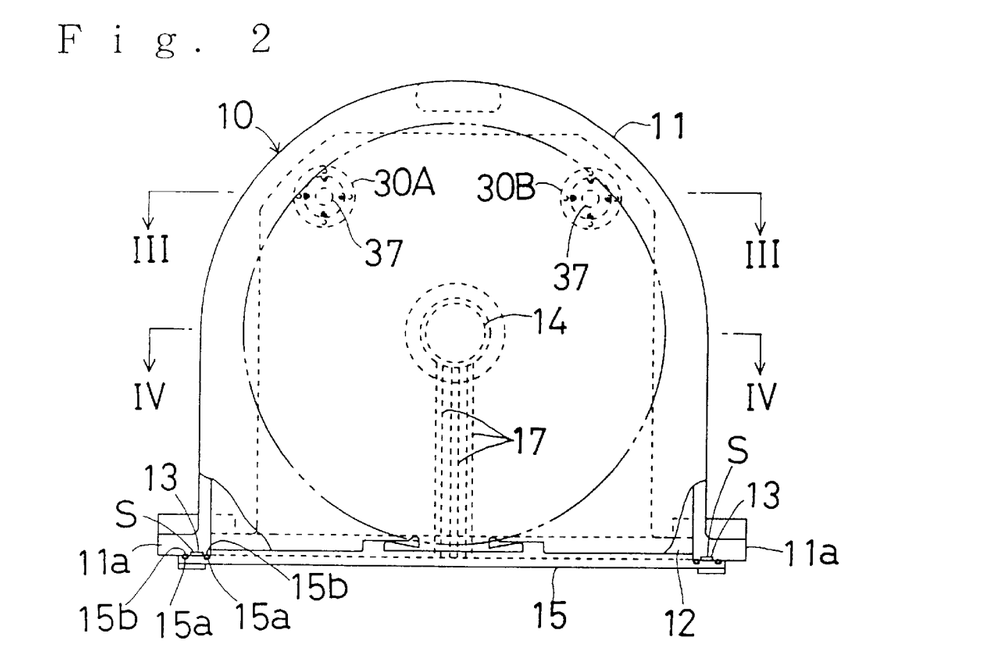
FIG. 2 is a plan view of the clean box, part of which is a sectional view.
Figure 3:
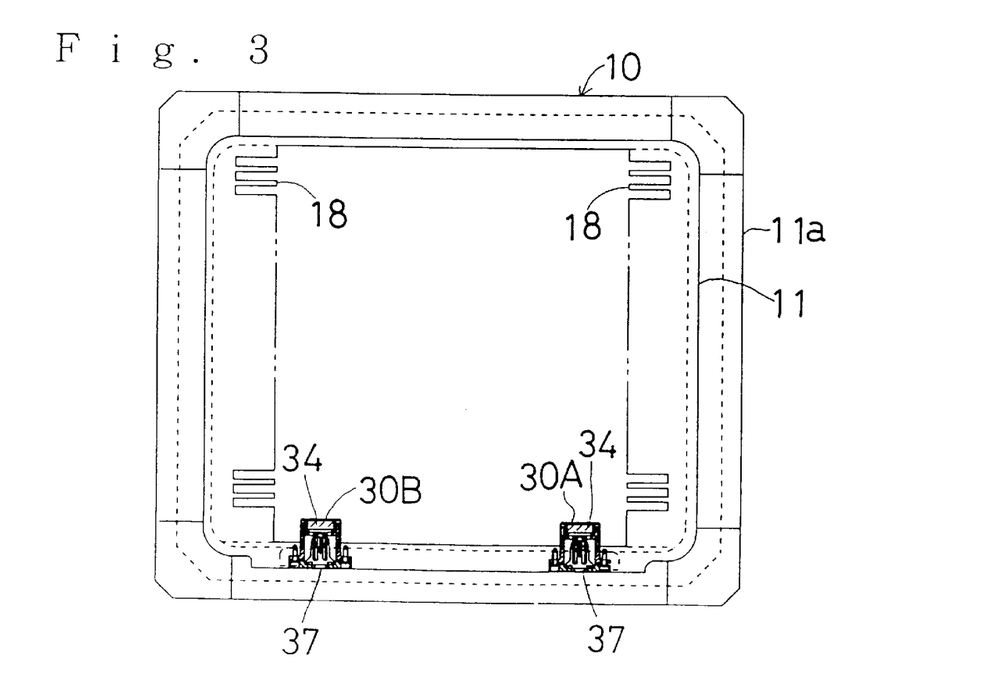
FIG. 3 is a sectional view along line III—III of FIG. 2.
Figure 4:
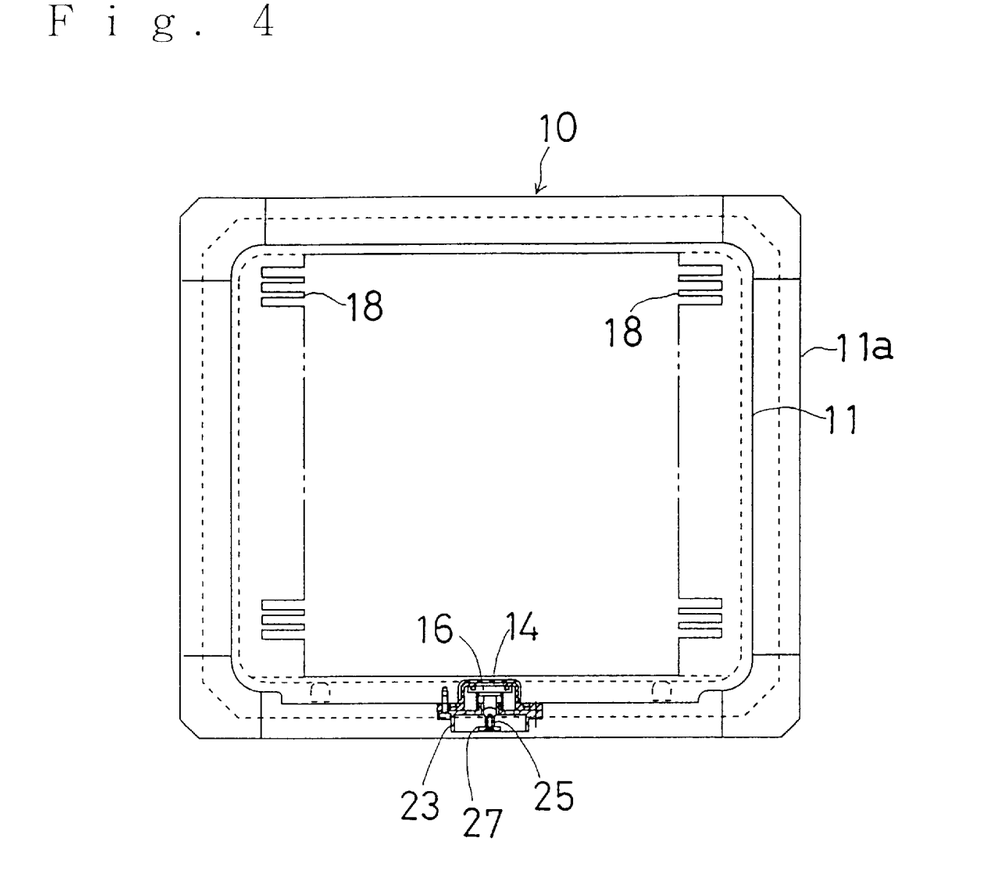
FIG. 4 is a sectional view along line IV—IV of FIG. 2.
Figure 5:
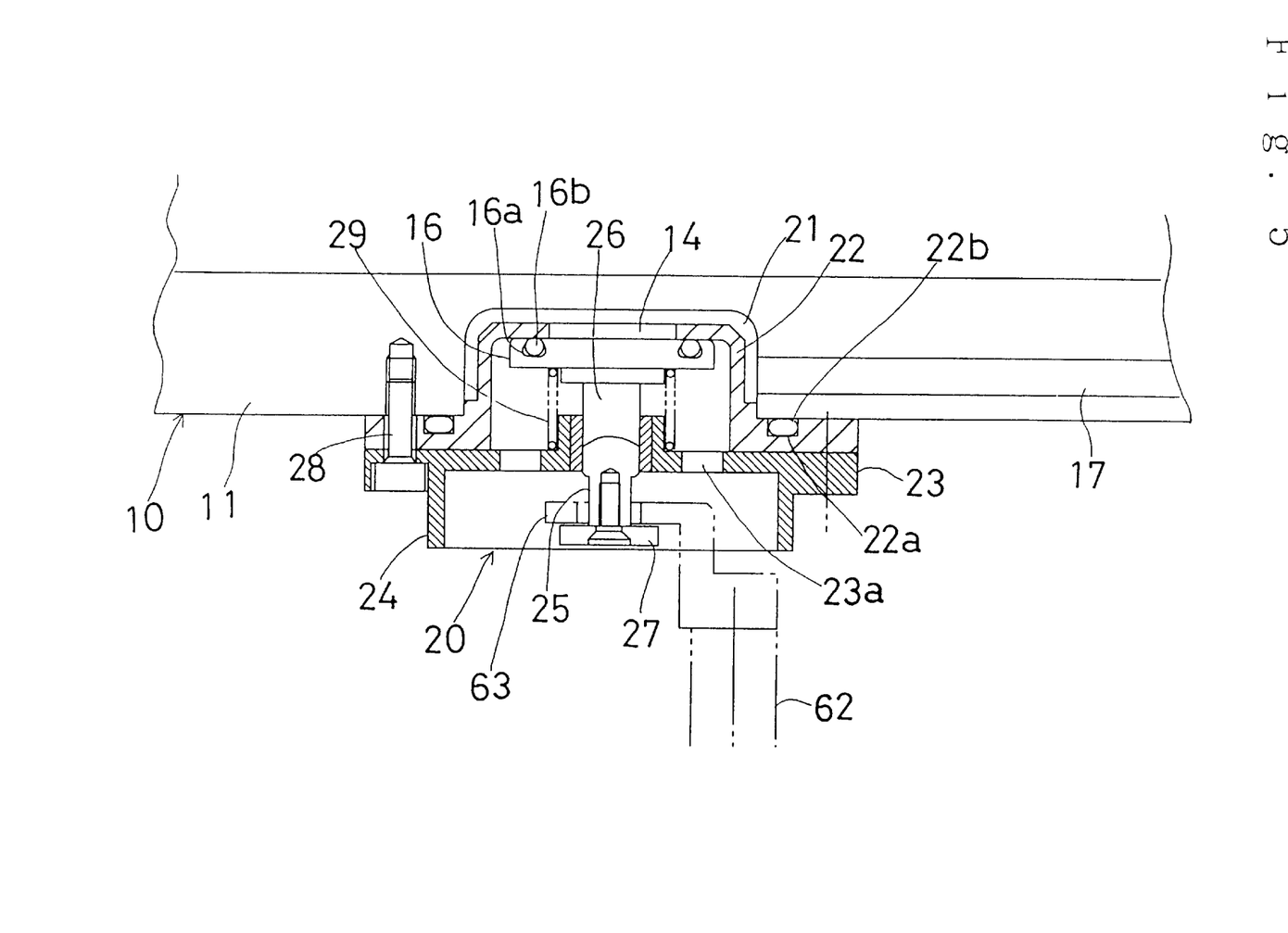
FIG. 5 is an enlarged sectional view of the part around an intake/exhaust port in the bottom of the box body.
Figure 6:
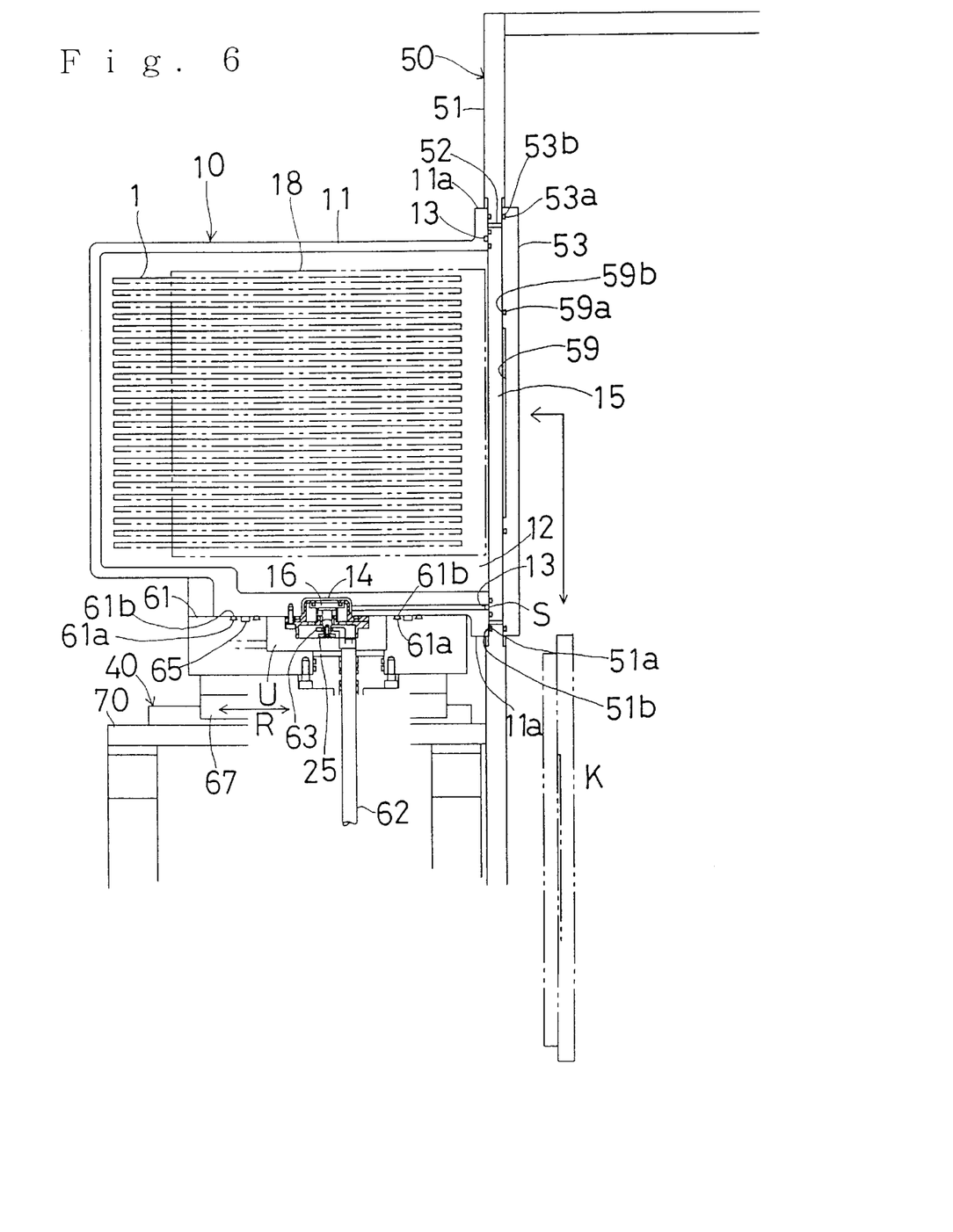
FIG. 6 is a front sectional view to show a connection preparation stage for connection between the clean box and the clean device, in which the clean box is mounted on a vacuum changer.

FIG. 1 is a sectional view of an enlarged main part of the clean box and the clean transfer method and apparatus in the embodiment of the present invention, FIG. 2 is a plan view, partly in cross section, to show the overall structure of the clean box, FIG. 3 is a sectional view along the line III—III of FIG. 2, FIG. 4 is a sectional view along the line IV—IV of FIG. 2, FIG. 5 is a sectional view of an enlarged main part of FIG. 4, and FIG. 6 is a side sectional view to show the overall structure of the clean transfer method and apparatus.

In these figures, the clean box 10 is composed, as illustrated in FIG. 2, of a box body 11 having a side aperture 12 in one side surface, an annular groove 13 for suction surrounding the side aperture 12, in the one side surface, and an intake/exhaust port 14 for evacuation in communication with the annular groove 13 for suction through intake/exhaust passages 17 in the bottom surface; a side lid 15 as an opening/closing lid for hermetically closing the annular groove 13 for suction in a mounted state on the box body 11 to form a space S for suction and for hermetically closing the side aperture 12 while being sucked to the box body 11 by a pressure difference between inside and outside the suction space S; an additional lid 16 for hermetically closing the intake/exhaust port 14 by a pressure difference between inside and outside thereof, as illustrated in FIG. 5; a drop preventing means 20 for preventing a drop of the additional lid 16; and gas inlet and outlet valves (ports) 30A, 30B for feeding of the non-oxidizing gas, provided in the box body 11. The clean box secures airtightness enough to maintain a clean state during closing of the side lid 15 and additional lid 16, and the clean box has neither the evacuation means nor the transfer means. The gas inlet and outlet valves (ports) 30A, 30B for feeding of the non-oxidizing gas (nitrogen gas, the inert gas, or the like) have the same structure, either one being used as a gas inlet valve while the other as a gas outlet valve.

As shown in FIG. 1 to FIG. 3, the gas inlet and outlet valves 30A, 30B used for feeding of the non-oxidizing gas into the clean box 10 have the same structure, in which there are a valve body 32 of a metal such as stainless steel or the like, or a resin, a coil spring 33 as a compression spring, and a filter 34 for removal of dust provided in a cylindrical structure 31 of a metal such as stainless steel or the like, or a resin. The cylindrical structure 31 is composed of three portions, a bottom disk portion 31a, an intermediate cylinder portion 31b, and a filter mount portion 31c opening in the upper part, mutually and hermetically connected in union through an O-ring for hermetic sealing, and is fixed to the box body with screws 36 through fitting holes 35 of the box body 11. For hermetic sealing of each fitting portion of the gas inlet and outlet valves 30A, 30B, an O-ring 31e is fitted in a peripheral groove 31d of the intermediate cylinder portion 31b. A small aperture 37 for intake/exhaust of gas is formed in the center of the bottom disk portion 31a and an inside shaft 32c of the valve body 32 is slidably supported by a sliding bearing member 38 fixed to an inner cylinder 31f of the intermediate cylinder portion 31b. A coil spring 33 urges the valve body 32 in such a direction that the valve body 32 closes the small aperture 37 for intake/exhaust of gas. An annular groove 32a is formed in an opposite surface of the valve body 32 to the bottom disk portion 31a and an O-ring 32b for hermetic sealing is provided in the annular groove 32a in each valve. The coil spring 33 has the elasticity enough to push and deform the O-ring 32b against the bottom disk portion 31a in order to implement the hermetic sealing with certainty. Vent holes 31g are formed in the upper part of the intermediate cylinder portion 31b, a gas intake/exhaust passage 39 connected to the inside space of the box body 11 is formed inside the intermediate cylinder portion 31b and the filer mount portion 31c, and the filter 34 for removal of dust is placed in the filter mount portion 31c. The filter 34 for removal of dust provided in the gas intake/exhaust passage 39 functions to prevent the dust and fine particles from entering the clean box 10.

As seen from FIG. 4 and FIG. 5, the intake/exhaust port 14 for vacuum suction of the side lid 15 to the box body 11 is located in the center of the bottom of the box body 11. In this example, in order to provide the intake/exhaust port 14 at a recessed position from the bottom surface of the box body 11, a circular recess 21 in communication with the intake/exhaust passages 17 is formed in the thick part of the bottom of the box body 11, a cylindrical member 22 provided with a flat upper end surface is fixed with screws 28 so as to cover the cylindrical recess 21, and the intake/exhaust port 14 is formed in the center of the upper end surface of the cylindrical member 22 provided with the upper end surface. The additional lid 16 for closing the intake/exhaust port 14 incorporates an engagement portion 25 on the lower surface side (or on the back surface side), the engagement portion 25 being composed of a shaft portion 26 and a large diameter portion (or a wide portion) 27 fixed to the lower end of the shaft portion 26. The shaft portion 26 of the additional lid 16 is supported vertically slidably by a stationary support member 23 fixed with the screws 28 to the box body 11 so as to surround (or cover) the intake/exhaust port 14. A coil spring (compression spring) 29 is provided around the shaft portion 26 and presses to urge the additional lid 16 toward the intake/exhaust port 14. In order to avoid shock on the engagement portion 25, for example, when the clean box 10 is mounted, a cylindrical portion 24 for guard is integrally formed in the stationary support member 23. The stationary support member 23 is provided with vent holes 23a.

As shown in the overall structure of the clean box of FIG. 2, the part around the side aperture 12 of the box body 11 is a side flange portion 11a and an annular groove 13 for vacuum suction of the side lid 15 is formed so as to make a round in an opposite surface of the side flange portion 11a to the side lid (a joint surface to the side lid). The annular groove 13 and the intake/exhaust port 14 are connected with each other through the inside of the intake/exhaust passages 17 and circular recess 21 formed in the thick part of the bottom of the box body 11.

For assuring airtightness, an annular groove 15a is formed at each of positions for hermetically sealing the inside periphery and the outside periphery of the annular groove 13 in the opposite surface of the side lid 15 in contact with the side flange portion 11a of the box body 11, and an O-ring 15b for hermetic sealing is fitted in each of the annular grooves 15a. Further, an annular groove 22a is formed in an opposite surface of the cylinder member 22 provided with the upper end surface to the bottom surface of the box body 11, as illustrated in FIG. 5, and an O-ring 22b for hermetic sealing is provided in the annular groove 22a. An annular groove 16a is also formed for assuring airtightness in the opposite surface of the additional lid 16 in contact with the peripheral part of the intake/exhaust port 14 and an O-ring 16b for hermetic sealing is fitted in the annular groove 16a.

There is a holder 18 for supporting the objects 1 to be transferred, such as the semiconductor wafers or the like, in the box body 11. The holder 18 is constructed, for example, in such structure that many objects 1 can be stored at equal intervals in a horizontal state.

As illustrated in FIG. 6, a clean device 50 (a device having a clean room or a hermetically closed space of a non-oxidizing gas ambient) has a gate aperture (entrance/exit) 52 in its side wall 51 in order to allow the objects 1, such as the semiconductor wafers or the like, to be carried into the clean device by use of the clean box 10 or in order to allow the objects 1 to be carried out thereof into the clean box 10. This gate aperture 52 is arranged to be able to be opened or closed by a gate valve 53. Namely, the gate valve 53 is driven by a gate valve opening/closing mechanism (not illustrated) set behind it so as to perform an operation from a closed state of the gate aperture 52 to a drawn state into the clean device 50 or a reverse operation. For assuring airtightness, an annular groove 53a is formed in an opposite surface of the gate valve 53 in contact with the peripheral part of the gate aperture 52 and an O-ring 53b for hermetic sealing is provided in the annular groove 53a.

A suction recess 59 for vacuum suction of the side lid 15 on the clean box 10 side is formed in the gate valve 53, an annular groove 59a is formed so as to surround the suction recess 59, and an O-ring 59b for hermetic sealing is fitted in the annular groove 59a.

A vacuum changer 40 (provided with an evacuation means) is provided for evacuating the inside of the annular groove 13 through the intake/exhaust port 14 for the purpose of the vacuum suction of the side lid 15 to the box body 11 of the clean box 10 or for returning the inside of the annular groove 13 to the atmospheric pressure, and this vacuum changer 40 also incorporates a gas feeding/discharging mechanism 41 for introducing the non-oxidizing gas (nitrogen gas, the inert gas, or the like) into the clean box 10 as shown in the lower part of FIG. 1. The vacuum changer 40 is normally placed at a position outside the clean device 50 and below the gate aperture 52 and this vacuum changer 40 has a cup-shape mount stage 61 as a box holding member for holding the clean box 10 at a height suitable for connection to the gate aperture 52 of the clean device 50 so as to be slidable horizontally (in directions along an arrow R). Namely, the cup-shape mount stage 61 is attached via horizontal sliders 67 to a fixed base 70 of the vacuum changer 40, so as to be able to be moved toward or away from the side wall 51 of the clean device 50.

A hook arm member 63 (indicated by fictitious lines in FIG. 5), which is a changer-side engagement member for forcing the additional lid 16 away from the intake/exhaust port 14 on the box body 11 side, is fixed to an upper end of an up-and-down rotational shaft 62 vertically penetrating the inside central part of the cup-shape mount stage 61. This hook arm member 63 can engage (or can be hooked on) the engagement portion 25 composed of the shaft portion 26 and the large diameter portion (or wide portion) 27 incorporated in the additional lid 16, and can also be disengaged therefrom by rotating the up-and-down rotational shaft 62.

An annular groove 65 for vacuum suction of the bottom surface of the clean box 10 is formed in a clean box mount surface of the cup-shape mount stage 61, an annular groove 61a for assuring airtightness is formed in each of the inside and outside of the annular groove 65, and an O-ring 61b for hermetic sealing is set in each of the annular grooves 61a.

For assuring airtightness, an annular groove 51a surrounding the gate aperture 52 is formed in the outside opposite surface of the side wall 51 in contact with the side flange portion 11a of the clean box 10 (the peripheral part of the side aperture 12) and an O-ring 51b for hermetic sealing is provided in the annular groove 51a.

Further, as illustrated in the lower part of FIG. 1, the gas feeding/discharging mechanism 41 incorporated in the vacuum changer 40 has gas feed and discharge ports 42A, 42B, which correspond to the two gas inlet/outlet valves 30A, 30B in the clean box 10 sucked to and held on the cup-shape mount stage 61, in the mount surface of the cup-shape mount stage 61 for mounting the clean box 10, and the mechanism also has push pins 43 which can be projected out of the corresponding gas feed and discharge ports 42A, 42B. Each of the push pins 43 is arranged to be driven up and down by an up-and-down driving mechanism 44 of an electromagnetic plunger, an air cylinder, or the like. In the cup-shape mount stage 61 there are gas feed/discharge passages 45A, 45B each in communication with the gas feed/discharge port 42A, 42B, respectively.

For replacing the inside of the clean box 10 with a clean non-oxidizing gas (the nitrogen gas, the inert gas, or the like), the push pins 43 of the gas feed/discharge ports 42A, 42B are moved up by the up-and-down driving mechanisms 44 to push the valve bodies 32 up on the side of the gas inlet/outlet valves 30A, 30B to open the small apertures 37 for intake/exhaust of gas, and in this state the non-oxidizing gas is supplied through one of the gas feed/discharge passages, for example, through the gas feed/discharge passage 45A, thereby introducing the gas via the gas feed/discharge port 42A and the gas inlet/outlet valve 30A into the clean box 10. At the same time as it, the gas having filled the clean box before the introduction of the non-oxidizing gas is discharged via the gas inlet/outlet valve 30B and the gas feed/discharge port 42B from the other gas feed/discharge passage 45B. After the gases are allowed to flow for a fixed time, the push pins 43 of the gas feed and discharge ports 42A, 42B are moved down by the up-and-down driving mechanisms 44 to close each of the valve bodies 32 of the gas inlet/outlet valves 30A, 30B.

Next, the overall operation of this embodiment will be described.

When the objects 1 to be transferred are transferred between the clean box 10 and the clean device 50 in the ambient of the clean non-oxidizing gas (the nitrogen gas, the inert gas, or the like), the clean box 10 is mounted on the cup-shape mount stage 61 of the vacuum changer 40, as shown in FIG. 6, and the annular groove 65 for suction undergoes vacuum suction to make the bottom surface of the clean box 10 (the box body 11) sucked to and held on the cup-shape mount stage 61. In this held state of the clean box 10, the cup-shape mount stage 61 is moved toward the side wall 51 to make the side flange portion 11a of the box body 11 hermetically pressed against the outside surface of the side wall 51 in the peripheral part of the gate aperture 52. At this time, the side lid 15 moves into the gate aperture 52 to go into close fit to the gate valve 53 hermetically closing the gate aperture 52 and the vacuum suction of the suction recess 59 on the gate valve 53 side is also effected to suck and hold the side lid 15 on the side of the gate valve 53, too.

Here, supposing the inside of the clean box 10 is vacant and is not filled with the non-oxidizing gas (the nitrogen gas, the inert gas, or the like), the push pins 43 of the gas feeding/discharging mechanism 41, illustrated in the lower part of FIG. 1, are moved up to open the gas inlet/outlet valves 30A, 30B, whereby the clean non-oxidizing gas is introduced through one gas inlet/outlet valve 30A into the clean box 10 while the gas in the clean box 10 is discharged through the other gas inlet/outlet valve 30B, thereby replacing the inside of the clean box 10 with the non-oxidizing gas in the fixed time.

Then the inside space U of the cup-shape mount stage 61, the upper surface of which is hermetically closed by the clean box 10, is evacuated to cancel the pressure difference between inside and outside of the additional lid 16 (the inside of the intake/exhaust port 14 and the inside space U both becoming vacuum), thereby turning the additional lid 16 into an openable state. Then the up-and-down rotational shaft 62 is rotated to hook the hook arm member 63 on the engagement portion 25 of the additional lid 16, as indicated by the fictitious lines of FIG. 5, and then the up-and-down rotational shaft 62 is moved down. This lowers the additional lid 16 against the elasticity of the coil spring 29 to open the intake/exhaust port 14 on the bottom surface side of the box body 11.

Next, the inside space U of the cup-shape mount stage 61 is injected with clean gas such as clean air, nitrogen, or the like (preferably, the non-oxidizing gas) to return the inside space U, the inside of the intake/exhaust port 14 of the clean box 10 in communication therewith, and the inside of the annular groove 13 for suction in communication therewith to the atmospheric pressure. Since this releases the vacuum suction of the side lid 15 (the inside of the annular groove 13 and the clean device 50 both being the atmospheric pressure), the side lid 15 is in a sucked and held state by only the gate valve 53. Then the gate valve 53 is moved away from the gate aperture 52 to the position of fictitious lines K of FIG. 6 by the gate valve opening/closing mechanism. As a consequence, the side lid 15 is drawn into the clean device 50 to open the gate aperture 52. In this state, the inside of the clean box 10 and the clean device 50 compose a continuous space in the ambient of the non-oxidizing gas (the nitrogen gas, the inert gas, or the like). Therefore, the objects 1 to be transferred can be horizontally transferred successively onto the vacant holder 18 of the clean box 10 with a carry robot or the like provided on the clean device 50 side, whereby the desired number of objects 1 can be stored in the clean box 10.

After the desired number of objects 1 are transferred to the clean box 10, the gate valve opening/closing mechanism is actuated to press the gate valve 53 against the inside peripheral part of the side wall 51 having the gate aperture 52, so as to hermetically close the gate aperture 52 and press the side lid 15 under vacuum suction by the gate valve 53, against the side flange portion 11a of the box body 11. In the state in which the side aperture 12 of the clean box 10 is hermetically closed by the side lid 15, the additional lid 16 is opened by the hook arm member 63, and the inside space U of the cup-shape mount stage 61 and the inside of the annular groove 13 (the inside of the suction space S) of the clean box 10 in communication therewith are evacuated through the intake/exhaust port 14. After completion of the evacuation, the engagement is released between the hook arm member 63 and the engagement portion 25 of the additional lid 16 to make the additional lid 16 pressed against the intake/exhaust port 14 by the elasticity of the coil spring 29. After that, the inside space U of the cup-shape mount stage 61 is made to leak with the clean gas such as the clean air, nitrogen, or the like (preferably, the non-oxidizing gas) to return the inside space U to the atmospheric pressure, whereby the side lid 15 and additional lid 16 hermetically seal the side aperture 12 and the intake/exhaust port 14 with certainty by the pressure difference between inside and outside, because the inside of the annular groove 13 and the intake/exhaust port 14 on the clean box 10 side is the vacuum while the outside is the atmospheric pressure. Then the suction of the side lid 15 by the gate valve 53 is released, whereby the clean box 10 becomes free to carry alone as illustrated in FIG. 2. Therefore, the clean box 10 can be transferred to an arbitrary position by an automatic guided vehicle or the like.

If the clean device 50 is in a clean gas ambient but not in the non-oxidizing gas ambient, the following operation will be carried out; the objects 1 to be transferred are transferred into the clean box 10, the side lid 15 is placed to close the aperture and undergoes the vacuum suction, and thereafter the inside of the clean box 10 is replaced with the clean non-oxidizing gas by the gas feeding/discharging mechanism 41 incorporated in the vacuum changer 40.

The embodiment described above has the following effects.

(1) While the clean box 10 is mounted on the vacuum changer 40, the non-oxidizing gas such as the nitrogen gas, the inert gas, or the like can be automatically introduced and charged into the clean box 10 through the gas inlet/outlet valves 30A, 30B by the gas feeding/discharging mechanism 41 incorporated in the vacuum changer 40.

(2) Although there is the risk of an oxygen-deficient accident in use of the non-oxidizing gas such as the nitrogen gas, the inert gas, or the like, the inside of the clean box 10 can be replaced with the non-oxidizing gas in the perfect, hermetically closed state. Therefore, safety is assured.

(3) The filters 34 for removal of dust are provided in the gas intake/exhaust passages 39 running from the small apertures 37 for gas intake/exhaust of the gas inlet/outlet valves 30A, 30B to the inside space of the box body 11, so as to prevent the dust and fine particles from entering the inside of the clean box 10 during the introduction of the non-oxidizing gas.

Although the above embodiment was described in such structure that the gas feeding/discharging mechanism 41 was incorporated in the vacuum changer 40 for opening or closing the side lid 15 of the clean box 10, the gas feeding/discharging mechanism 41 can also be provided as a separate device independent of the vacuum changer 40. In order to hold the side lid 15 by the vacuum suction to the box body 11, the gas inlet/outlet valves 30A, 30B and the intake/exhaust port 14 used for evacuating the inside of the annular groove 13 for suction were placed in the bottom surface of the clean box 10; but the intake/exhaust port 14 and the gas inlet/outlet valves 30A, 30B can also be placed in an arbitrary surface except for the surface having the side aperture 12 of the box body 11, according to the type of the clean box.

For the drop preventing means 20 of the additional lid 16 for opening or closing the intake/exhaust port 14 and for the mechanism for opening or closing the gate aperture 52 of the clean device 50 by the gate valve 53, an appropriate configuration can be employed from various configurations in order to achieve their purpose.

The embodiment of the present invention was described above, but it is apparent to those skilled in the art that the present invention is not limited to the embodiment but the invention can embrace various modifications and changes within the spirit and scope of the appended claims.

What is claimed is:

1. A clean transferring and storing method for a semiconductor wafer, comprising:

providing a clean box comprising a box body having an aperture in one surface, a lid configured to close said aperture hermetically, a gas inlet valve and a gas outlet valve provided in said box body, and a groove formed between said box body and said lid such that a suction space surrounding said aperture is formed when said clean box is closed by said lid;

opening said gas inlet valve and said gas outlet valve when said aperture of said clean box is closed by said lid;

introducing a non-oxidizing gas through said gas inlet valve to purge gases having been present in said clean box through said gas outlet valve so as to fill said box with the non-oxidizing gas; and closing said gas inlet valve and said gas outlet valve so as to keep a semiconductor wafer stored in said clean box under non-oxidizing gas atmosphere.

2. A clean box comprising:

a box body having an aperture in one surface;

a lid configured to close said aperture hermetically;

a groove formed between said box body and said lid such that a suction space surrounding said aperture is formed when said clean box is closed by said lid;

a port in communication with said groove for evacuation of said groove;

a gas inlet valve provided in said box body; and a gas outlet valve provided in said box body.

3. A clean transfer apparatus comprising:

a clean box including a box body having an aperture in one surface, a lid configured to close said aperture hermetically, a groove formed between said box body and said lid such that a suction space surrounding said aperture is formed when said clean box is closed by said lid, a port in communication with said groove for evacuation of said groove, and a gas inlet valve and a gas outlet valve provided in said box body; and a gas feeding/discharging mechanism configured to open said gas inlet valve and said gas outlet valve when the aperture of said box body is closed by said lid, to introduce a non-oxidizing gas through said gas inlet valve into said clean box, and to discharge gases having filled said clean box before introduction of said non-oxidizing gas, through said gas outlet valve from the clean box.

* * * * *